(12) United States Patent
Chan et al.

(10) Patent No.: US 9,190,355 B2
(45) Date of Patent: Nov. 17, 2015

(54) MULTI-USE SUBSTRATE FOR INTEGRATED CIRCUIT

(71) Applicants: Weng Hoong Chan, Petaling Jaya (MY); Ly Hoon Khoo, Bandar Puteri Klang (MY); Boon Yew Low, Petaling Jaya (MY); Navas Khan Oratti Kalandar, Petaling Jaya (MY)

(72) Inventors: Weng Hoong Chan, Petaling Jaya (MY); Ly Hoon Khoo, Bandar Puteri Klang (MY); Boon Yew Low, Petaling Jaya (MY); Navas Khan Oratti Kalandar, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 6 days.

(21) Appl. No.: 14/255,957

(22) Filed: Apr. 18, 2014

(65) Prior Publication Data

US 2015/0303137 A1  Oct. 22, 2015

(51) Int. Cl.
| | | |
|---|---|---|
| *H01L 23/48* | (2006.01) | |
| *H01L 23/52* | (2006.01) | |
| *H01L 29/40* | (2006.01) | |
| *H01L 23/498* | (2006.01) | |
| *H01L 23/00* | (2006.01) | |

(52) U.S. Cl.
CPC .... *H01L 23/49811* (2013.01); *H01L 23/49816* (2013.01); *H01L 24/33* (2013.01); *H01L 24/49* (2013.01); *H01L 24/73* (2013.01); *H01L 24/83* (2013.01); *H01L 24/85* (2013.01); *H01L 24/90* (2013.01); *H01L 2224/32225* (2013.01); *H01L 2224/48106* (2013.01); *H01L 2224/48227* (2013.01); *H01L 2224/73265* (2013.01); *H01L 2224/8385* (2013.01); *H01L 2924/01029* (2013.01); *H01L 2924/14* (2013.01); *H01L 2924/15311* (2013.01); *H01L 2924/15312* (2013.01); *H01L 2924/15313* (2013.01)

(58) Field of Classification Search
USPC .................. 257/772, 779, E23.015, E23.02, 257/E23.023–E23.079, 737, 774, 738, 257/E23.021, E21.502, E21.509, 780; 438/51, 613, 118, 667
See application file for complete search history.

(56) References Cited

U.S. PATENT DOCUMENTS

| | | | | |
|---|---|---|---|---|
| 5,756,380 | A * | 5/1998 | Berg | H01L 23/3128 438/125 |
| 6,075,710 | A * | 6/2000 | Lau | H01L 23/49816 174/255 |
| 6,177,731 | B1 * | 1/2001 | Ishida | H01L 21/563 257/772 |
| 6,333,856 | B1 | 12/2001 | Harju | |
| 7,476,811 | B2 | 1/2009 | Kubota | |
| 8,779,303 | B2 * | 7/2014 | Chang | 174/538 |
| 8,836,098 | B1 * | 9/2014 | Sukemi | H01L 23/49816 257/678 |
| 8,921,994 | B2 * | 12/2014 | Higgins, III | H01L 21/565 257/692 |
| 8,981,577 | B2 * | 3/2015 | Joshi | H01L 21/563 257/777 |
| 2004/0090756 | A1 * | 5/2004 | Ho | H01L 21/6835 361/767 |
| 2004/0113252 | A1 * | 6/2004 | Vonstaudt | H01L 23/49838 257/684 |

(Continued)

*Primary Examiner* — Dao H Nguyen
*Assistant Examiner* — Tram H Nguyen
(74) *Attorney, Agent, or Firm* — Charles Bergere

(57) ABSTRACT

A sub-assembly for a packaged integrated circuit (IC) device has a planar substrate. The substrate's top side has multiple sets electrically connected bond posts arranged in corresponding nested contour zones. Each contour zone includes a different bond post of each bond-post set. The bottom side has a different set of pad connectors electrically connected to the each top-side bond-post set. The sub-assembly can be used for different IC packages having IC dies of different sizes, with different contours of bond posts available for electrical connection depending on the size of the IC die.

18 Claims, 7 Drawing Sheets

(56) References Cited

U.S. PATENT DOCUMENTS

| | | | |
|---|---|---|---|
| 2004/0173894 A1* | 9/2004 | Glenn | H01L 23/13 257/693 |
| 2006/0071320 A1* | 4/2006 | Shibata | H01L 23/552 257/691 |
| 2009/0039488 A1* | 2/2009 | Chan | H01L 23/49531 257/676 |
| 2010/0059873 A1* | 3/2010 | Chow | H01L 23/3128 257/686 |
| 2010/0181660 A1* | 7/2010 | Galera | H01L 25/0657 257/686 |
| 2010/0200898 A1* | 8/2010 | Lin | H01L 27/14618 257/294 |
| 2011/0101545 A1* | 5/2011 | Yeo | H01L 22/32 257/786 |
| 2011/0163428 A1* | 7/2011 | Galera | H01L 23/3677 257/675 |
| 2011/0233748 A1* | 9/2011 | Joshi | 257/690 |
| 2011/0316131 A1* | 12/2011 | Fukuda | H01L 21/561 257/668 |
| 2013/0043584 A1* | 2/2013 | Kwon | H01L 23/49822 257/737 |
| 2013/0207254 A1* | 8/2013 | Ossimitz | H01L 24/85 257/698 |
| 2013/0270698 A1* | 10/2013 | Chen | H01L 24/06 257/738 |
| 2013/0270705 A1* | 10/2013 | Wang | H01L 23/488 257/773 |
| 2014/0103507 A1* | 4/2014 | Guan | G01S 7/481 257/676 |
| 2015/0069603 A1* | 3/2015 | Foong | H01L 24/11 257/738 |

\* cited by examiner

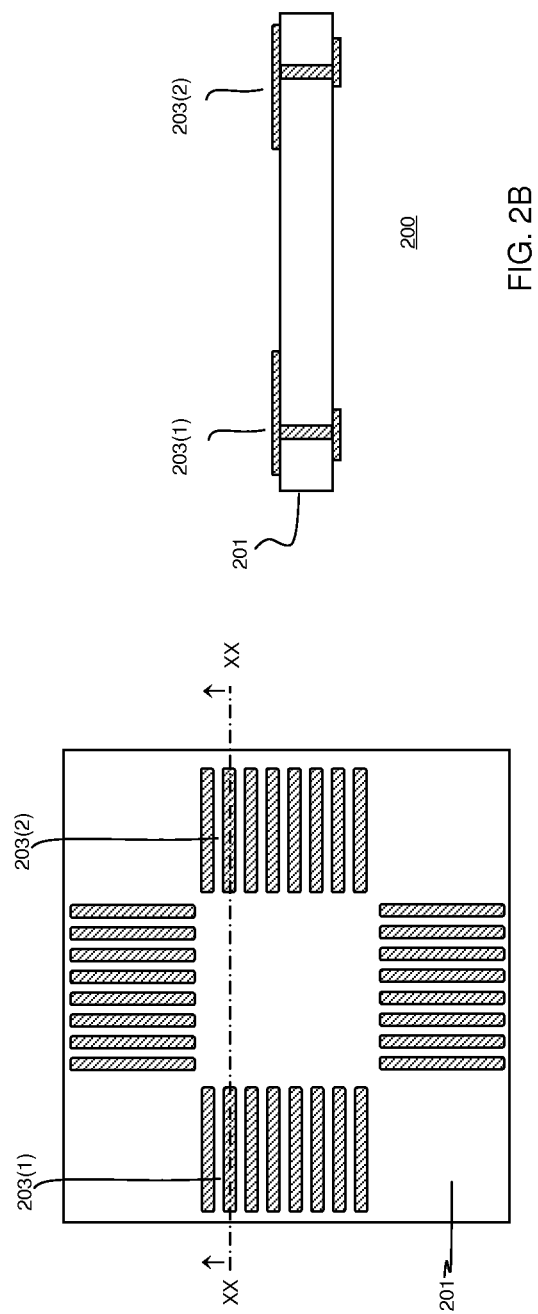

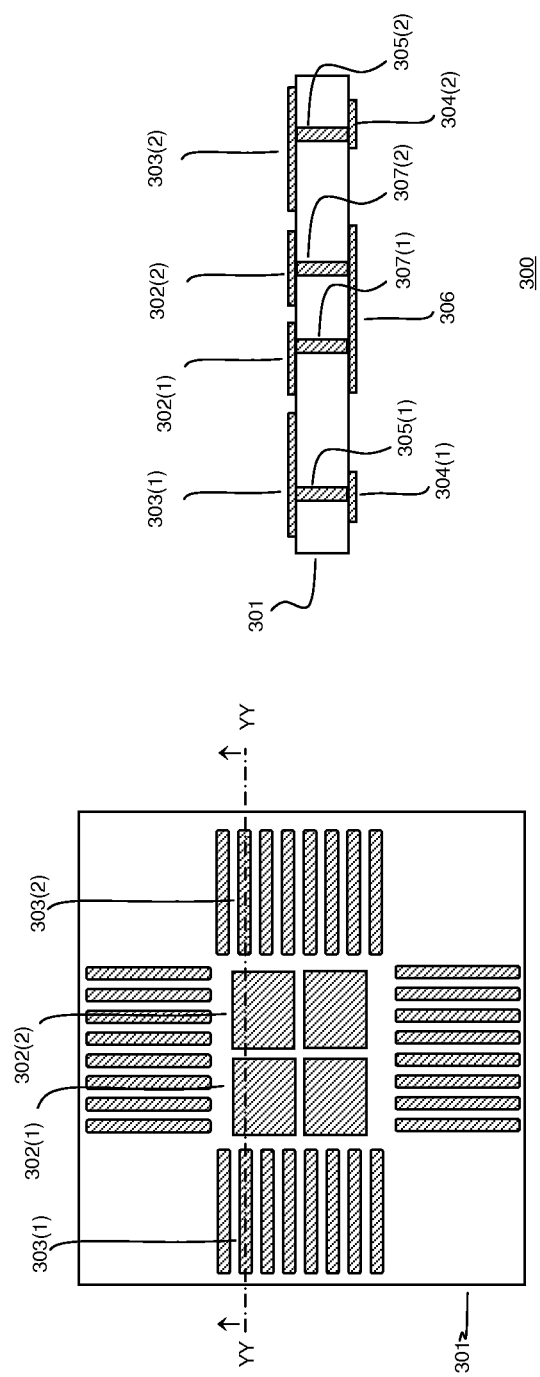

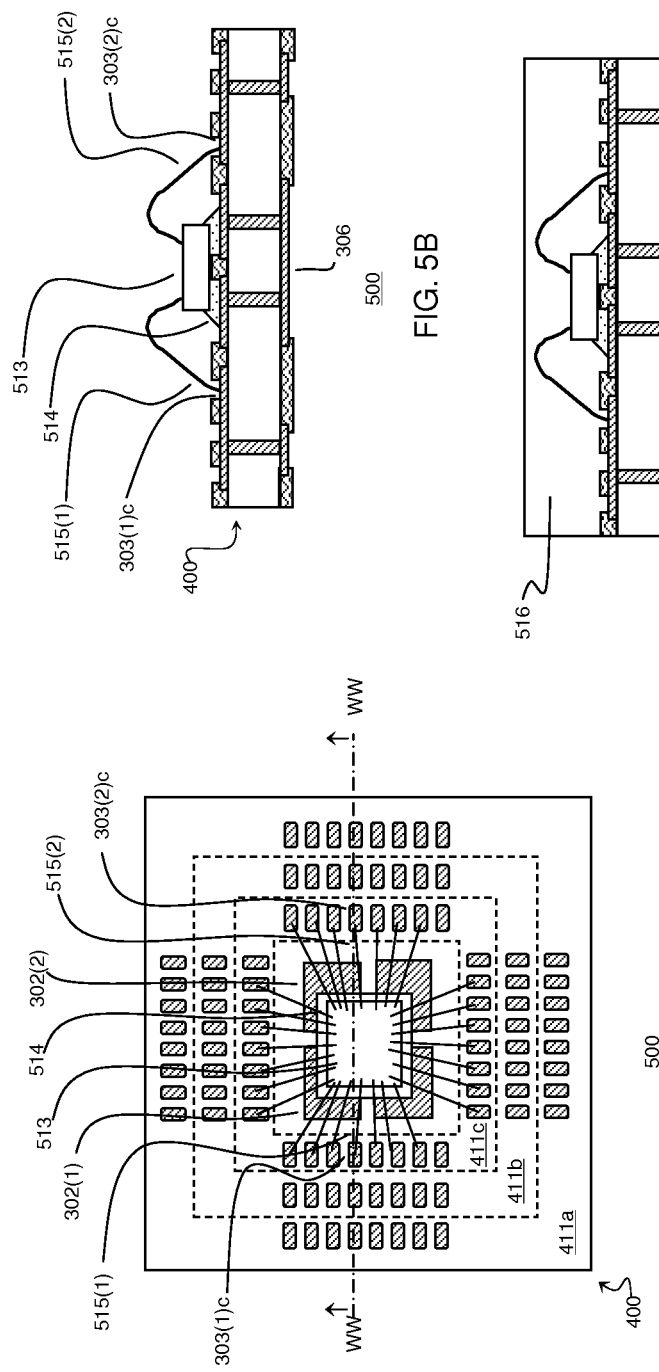

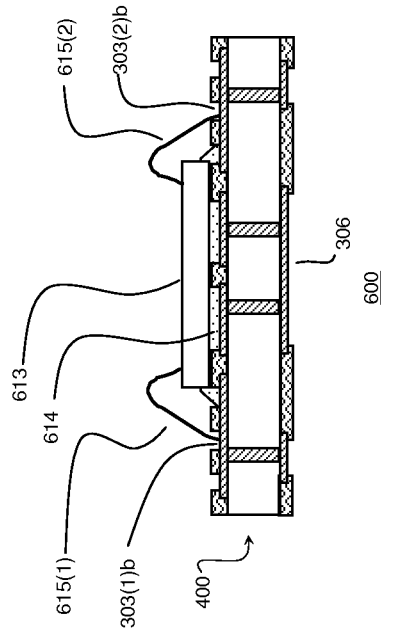
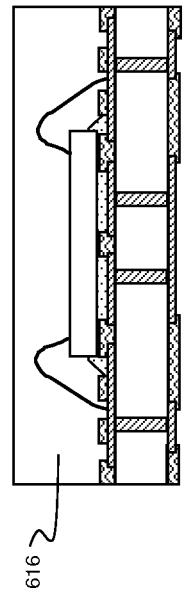
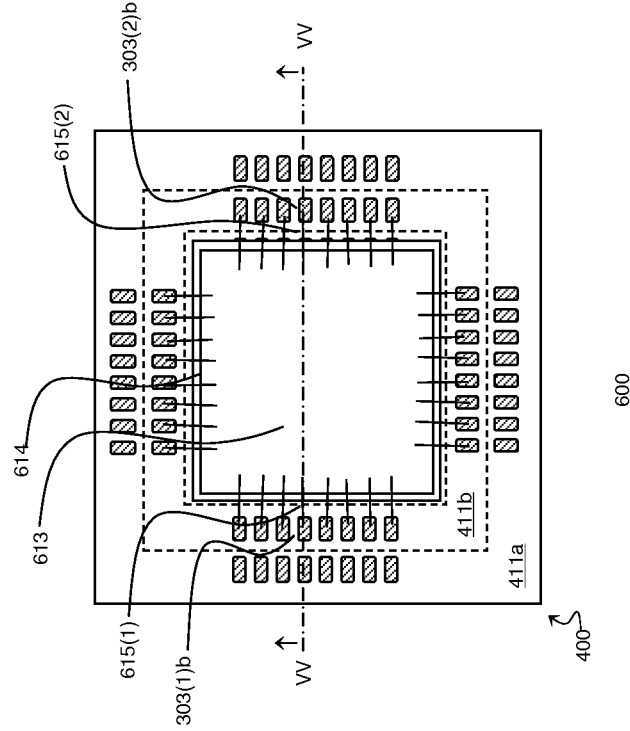

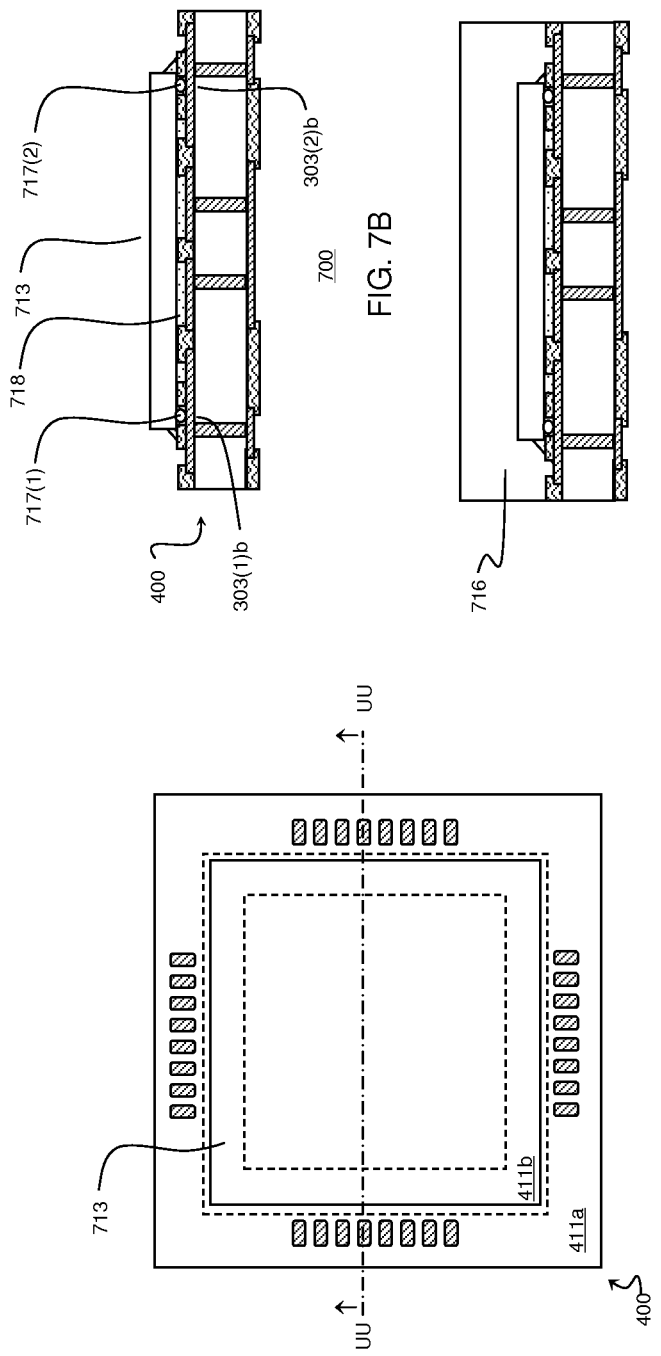

MULTI-USE SUBSTRATE FOR INTEGRATED CIRCUIT

BACKGROUND OF THE INVENTION

The present invention relates to integrated circuit (IC) packaging and, more particularly, to substrates used in IC packaging.

Surface-mount grid-array-type integrated circuit (IC) devices such as, for example, land grid array (LGA), ball grid array (BGA), and pin grid array (PGA) packages, electrically connect a die to a corresponding printed circuit board (PCB) through pad openings in their bottom surfaces. In contrast, some other surface-mount IC devices such as, small-outline IC (SOIC) or quad flat pack (QFP) packages—connect to a corresponding PCB through lead fingers emerging from the package sides.

The particular attachment mechanism between the pad openings of a grid-array-type IC device and a PCB may be, for example, (1) solder balls—as used for BGA devices, (2) pins on the IC device, which fit in a corresponding socket on the PCB—as used for PGA devices, or (3) pins on a corresponding socket on the PCB—as used for LGA devices. The pad openings are at the bottom of a PCB-like substrate of the packaged device. The package substrate may comprise materials similar to those of a typical PCB and may be similarly fabricated. Note that a package substrate is not the same as an IC die substrate, which is typically semiconductor bulk material, such as crystalline silicon. As used herein, unless otherwise indicated, the term "substrate" refers to a package substrate and not to an IC die substrate.

Each IC die of a grid-array-type package is typically mounted on the top side of the substrate and electrically connected to bond posts on the top side of the substrate. The die and top side of the substrate are then encapsulated in molding compound. Metallic vias connect the bond posts on the top side to corresponding pad connectors on the bottom side of the substrate. The pad connectors, in turn, electrically connect the substrate to the PCB. In a conventional new product introduction (NPI) process, a custom substrate is designed for a particular device based on the dimensions of the to-be-packaged die(s).

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements. Note that elements in the figures are not drawn to scale.

FIG. 2A shows a simplified plan view of a sub-assembly that represents an intermediary step in the assembly of an IC device in accordance with yet another embodiment of the invention.

FIG. 2B shows a simplified cross-sectional view of the sub-assembly of FIG. 2A.

FIG. 3A shows a simplified plan view of a sub-assembly that represents an intermediary step in the assembly of an IC device in accordance with an alternative embodiment of the invention.

FIG. 3B shows a simplified cross-sectional view of the sub-assembly of FIG. 3A.

FIG. 5A shows a simplified plan view of a sub-assembly in accordance with one embodiment of the present invention.

FIG. 5B shows a simplified cross-sectional view of the sub-assembly of FIG. 5A.

FIG. 5C shows a simplified cross-sectional view of the sub-assembly of FIG. 5B following encapsulation with molding compound.

FIG. 6A shows a simplified plan view of a sub-assembly in accordance with another embodiment of the present invention.

FIG. 6B shows a simplified cross-sectional view of the sub-assembly of FIG. 6A.

FIG. 6C shows a simplified cross-sectional view of the sub-assembly of FIG. 6A following encapsulation with molding compound.

FIG. 7A shows a simplified plan view of a sub-assembly in accordance with another embodiment of the present invention.

FIG. 7B shows a simplified cross-sectional view of the sub-assembly of FIG. 7A.

FIG. 7C shows a simplified cross-sectional view of the sub-assembly of FIG. 7A following encapsulation with molding compound.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

A multi-use planar substrate is usable with dies of different dimensions. The multi-use substrate connects each pad connector on the bottom side of the substrate to a plurality of bond posts on the top side of the substrate, where the bond posts of the plurality are located in different nested contour zones on the top side of the substrate. Using the multi-use substrate enables the use of the same model of substrate for multiple types of dies having a variety of dimensions. This allows for cost reductions due to, for example, economies of scale gained and reduced design time.

Certain embodiments of the present invention are directed to substrates that can be used with a variety of different dies of different sizes. The substrates have two or more concentric contours of bond posts surrounding an inner die paddle. Depending on the particular size of the die mounted onto the substrate, different contours will be available to making electrical connections to the die, e.g., using bond wires or bond balls.

Figure 1B:
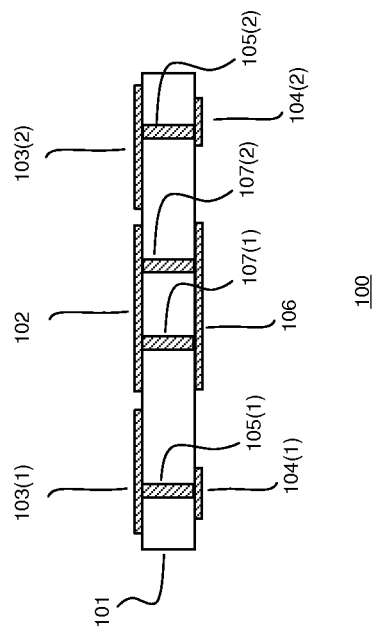
FIG. 1B shows a simplified cross-sectional view of the sub-assembly of FIG. 1A.
Figure 1A:
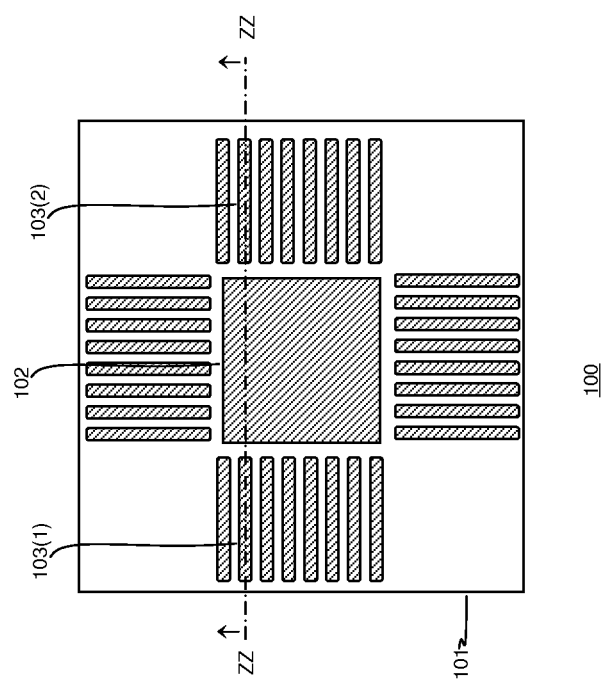
FIG. 1A shows a simplified plan view of a sub-assembly that represents an intermediary step in the assembly of an IC device in accordance with an embodiment of the invention.

FIG. 1A shows a simplified plan view of IC sub-assembly 100, comprising substrate 101 having a plurality of copper features on its top side. Sub-assembly 100 represents an intermediary step in the assembly of an LGA IC device in accordance with one embodiment of the present invention. Substrate 101 also has copper features on its bottom side (not shown in FIG. 1A). Copper pad 102 functions as a die paddle and a heat sink and is located at the center of the top side of substrate 101. In other words, pad 102 is designed for the mounting of one or more IC dies (not shown in FIG. 1A). Pad 102 is surrounded on all sides by a plurality of outwardly radiating, elongated copper traces 103, such as exemplary copper traces 103(1) and 103(2). Copper traces 103 are used to generate bond posts, as illustrated below. The copper traces and/or copper pads may have gold plating (not shown) applied to improve conductivity and provide protection against oxidation.

FIG. 1B shows a simplified cross-sectional view of sub-assembly 100 of FIG. 1A along cut line ZZ-ZZ. Note that dimensions—such as thicknesses—of elements in this and other figures are not necessarily to scale. Substrate 101 comprises a plurality of copper features on its bottom side. In particular, pad connectors 104 on the bottom side—such as exemplary pad connectors 104(1) and 104(2)—connect to corresponding copper traces 103 on the top side via corresponding copper vias 105—such as exemplary vias 105(1) and 105(2), respectively. Pad connectors 104 are designed for the later attachment of bond balls (not shown) for mounting sub-assembly 100 on a PCB (not shown). In addition, copper pad 106 on the bottom side connects to topside copper pad 102 via thermo-conductive copper vias 107—such as exemplary vias 107(1) and 107(2). Note that pads 102 and 106 may—instead of being pads connected by vias—be the top and bottom, respectively, of a bulk thermo-conductive rectangular prism in the middle of sub-assembly 100. Thermo-conductive material, as used herein, refers to material that has a thermal conductivity greater than 10 watts per meter per Kelvin.

FIG. 2A shows a simplified plan view of sub-assembly 200, which represents an intermediary step in the assembly of an IC device in accordance with an alternative embodiment of the invention. Elements of sub-assembly 200 that are similar to corresponding elements of sub-assembly 100 of FIG. 1A are either similarly labeled, but with a different prefix—such as, for example, copper traces 203—or unlabeled. Sub-assembly 200 does not have any copper pad in the die-paddle area. Consequently, sub-assembly 200 does not have a heat sink for any die(s) (not shown) that may be mounted on substrate 201.

FIG. 2B shows a simplified cross-sectional view of sub-assembly 200 of FIG. 2A along cut line XX-XX. As can be seen, sub-assembly 200 does not include a heat sink for any die(s) that may be mounted on substrate 200.

FIG. 3A shows a simplified plan view of sub-assembly 300, which represents an intermediary step in the assembly of an IC device in accordance with yet another alternative embodiment of the invention. Elements of sub-assembly 300 that are similar to corresponding elements of sub-assembly 100 of FIG. 1A are similarly labeled, but with a different prefix. Sub-assembly 300 comprises a plurality of copper pads 302—such as exemplary copper pads 302(1) and 302(2)—arranged in the die-paddle area of substrate 301—in place of single copper pad 102 of FIG. 1A.

FIG. 3B shows a simplified cross-sectional view of sub-assembly 300 of FIG. 3A along cut line YY-YY. Elements of sub-assembly 300 that are similar to corresponding elements of sub-assembly 100 of FIG. 1B are similarly labeled, but with a different prefix—such as, for example, pad connectors 304 and vias 305. Top-side copper pads 302 connect to bottom-side copper pad 306 via corresponding vias 307.

Figures 4A, 4B:
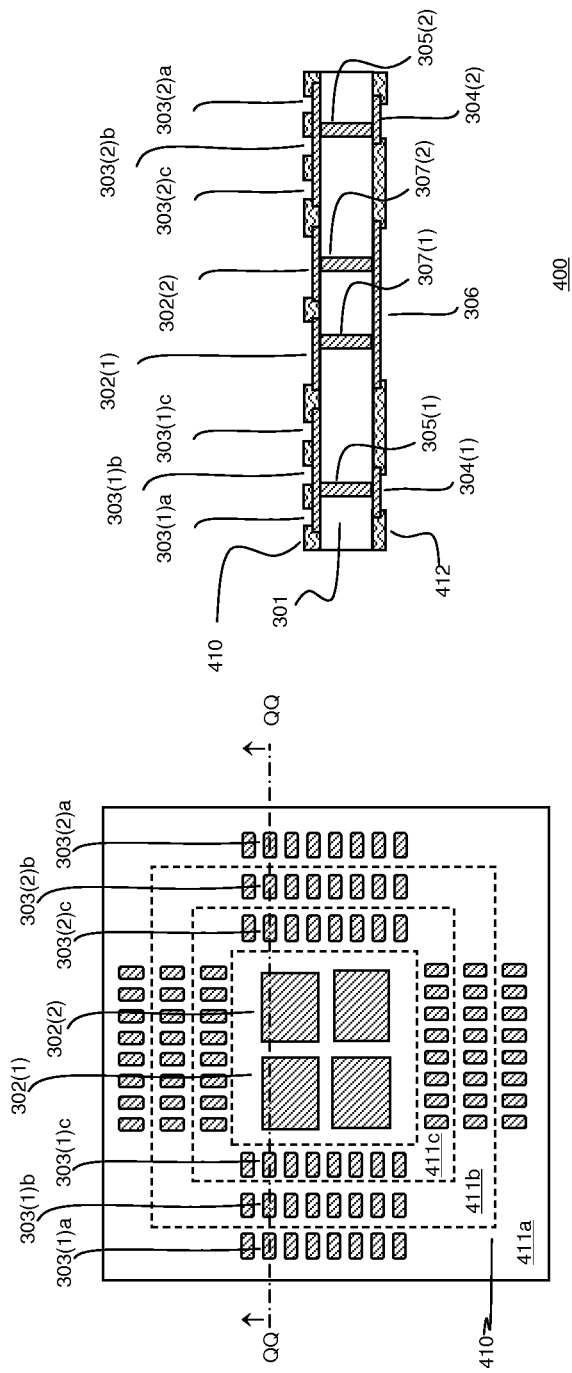
FIG. 4A shows a simplified plan view of a sub-assembly in accordance with one embodiment of the present invention.
FIG. 4B shows a simplified cross-sectional view of the sub-assembly of FIG. 4A.

FIG. 4A shows a simplified plan view of sub-assembly 400 in accordance with one embodiment of the present invention. Sub-assembly 400 comprises sub-assembly 300 of FIG. 3A after the application of solder mask. Solder mask provides structural and/or electrical protection to copper traces and/or other surface features of sub-assembly 400. The topside of sub-assembly 400 is covered with solder-mask layer 410 applied using, for example, screen printing or roller coating. Openings in solder-mask layer 410 are created, by, for example, etching, to expose (a) bond posts—such as exemplary bond posts 303(1)a, 303(1)b, 303(1)c, 303(2)a, 303(2)b, and 303(2)c and (b) copper pads—such as exemplary copper pads 302(1) and 302(2).

Note that bond posts 303(1)a, 303(1)b, and 303(1)c make up a first exemplary bond-post set corresponding to copper trace 303(1) of FIG. 3A while bond posts 303(2)a, 303(2)b, and 303(2)c make up a second exemplary bond-post set corresponding to copper trace 303(2) of FIG. 3A. Since the bond posts of a bond-post set are part of the same copper trace, the bond posts of a bond-post set are conductively connected (i.e., shorted) to each other. As used herein, conductive connection between two elements refers to either a direct connection between the two elements or a direct connection of the two elements to the same electrical conductor, such as, for example, a metal wire.

The top side of sub-assembly 400 includes three nested tier-like contour zones 411a-411c in the shape of rectangular rings. FIG. 4A shows the contour zones separated by dashed lines (which are not part of the actual structure). Each contour zone includes one pond post of each bond-post set. Thus, for example, contour zone 411a includes bond post 303(1)a of bond-post set 303(1), contour zone 411b includes bond post 303(1)b, and contour zone 411c includes bond post 303(1)c.

FIG. 4B shows a simplified cross-sectional view of sub-assembly 400 of FIG. 4A along cut line QQ-QQ. FIG. 4B shows portions of the bottom side of substrate 301 covered with solder mask layer 412, which may be the same material applied the same way as the above-described solder mask layer 410—but with openings for pad connectors rather than bond posts. Note that solder mask layers 410 and 412 are indicated in FIG. 4B with a zigzag fill pattern.

FIG. 5A shows a simplified plan view of sub-assembly 500 in accordance with one embodiment of the present invention. Sub-assembly 500 comprises sub-assembly 400 of FIG. 4A, with the addition of mounted and wire-bonded IC die 513. Die 513, which is relatively small in relation to the area of sub-assembly 400—covering less than a tenth of its area, is mounted over portions of copper pads 302 of the die paddle, using die-attach material (e.g., tape or epoxy) 514. Note that die-attach material may be thermal die-attach material for improved thermal conductivity of heat from a die to a corresponding heat sink. Die 513 is wire bonded to a plurality of bond posts located in contour zone 411c—the innermost contour zone—using bond wires such as exemplary bond wires 515(1) and 515(2), which connect to bond posts 303(1)c and 303(2)c, respectively.

FIG. 5B shows a simplified cross-sectional view of sub-assembly 500 of FIG. 5A along cut line WW-WW. Note that die-attach material 514 is illustrated using a light gray fill.

FIG. 5C shows a simplified cross-sectional view of sub-assembly 500 of FIG. 5B following encapsulation with molding compound 516.

FIG. 6A shows a simplified plan view of sub-assembly 600 in accordance with another embodiment of the present invention. Sub-assembly 600 comprises sub-assembly 400 of FIG. 4A, with the addition of mounted and wire-bonded IC die 613. Die 613, which is relatively medium-sized in relation to the area of sub-assembly 400—covering about a fifth of its area, is mounted over copper pads 302 of the die paddle, using die-attach material 614. Die 613 and die-attach material 614 cover up the bond posts of inner contour zone 411a, making those bond posts unavailable for wire bonding. Instead, die 613 is wire bonded to a plurality of bond posts located in contour zone 411b—the intermediary contour zone—using bond wires such as exemplary bond wires 615(1) and 615(2), which connect to bond posts 303(1)b and 303(2)b, respectively.

FIG. 6B shows a simplified cross-sectional view of sub-assembly 600 of FIG. 6A along cut line VV-VV.

FIG. 6C shows a simplified cross-sectional view of sub-assembly 600 of FIG. 6A following encapsulation with molding compound 616, which may be the same type of molding compound as molding compound 516 of FIG. 5C.

FIG. 7A shows a simplified plan view of sub-assembly 700 in accordance with another embodiment of the present invention. Sub-assembly 700 comprises sub-assembly 400 of FIG. 4A, with the addition of flip-mounted and ball-bonded IC die 713. Die 713, which is relatively large in relation to the area of sub-assembly 700—covering about a half of its area, is mounted over copper pads 302 (not seen) of the die paddle. Die 713 is ball bonded to a plurality of bond posts located in contour zone 411b—the intermediary contour zone—using bond balls (not shown in FIG. 7A), as described below.

FIG. 7B shows a simplified cross-sectional view of sub-assembly 700 of FIG. 7A along cut line UU-UU. Die 713 is mounted on and connected to sub-assembly 400 using bond balls such as exemplary bond balls 717(1) and 717(2), which connect to bond posts 303(1)b and 303(2)b, respectively. The space between die 713 and the top side of sub-assembly 400 is filled with underfill material 718, which may be an adhesive polymer and is illustrated with a light gray fill.

FIG. 7C shows a simplified cross-sectional view of sub-assembly 700 of FIG. 7A following encapsulation with molding compound 716.

Note that the bottom-side pad connectors used in LGA and BGA packaged devices may be referred to as solderball ball pad openings or, simply, pad openings. In some alternative embodiments—such as in PGA packaged devices, the pad connectors may be pins.

In some embodiments, the bottom-side pad connectors are in the form of a two-dimensional array. In some embodiments, each pad connector on the bottom side is connected to a plurality of bond posts on the top side. In some embodiments, only some pad connectors are connected to corresponding pluralities of top-side bond posts, while some pad connectors are connected to single corresponding top-side bond posts.

Embodiments of the invention have been described using copper for traces, pads, and vias. As would be appreciated by a person of ordinary skill in the art, the invention is not limited to copper traces, pads, and/or vias. Other electrically and/or thermally conductive materials—such as, for example, other metals or metal alloys—may be used in place of copper.

Embodiments of the invention have been described where all of the contour zones contain the same number of bond posts. In alternative embodiments, the number of bond posts in a contour zone is independent of the number of bond posts in other contour zones on the same device. In one exemplary implementation, outer contour zones have more bond posts than inner contour zones.

Embodiments of the invention have been described where a substrate top side comprises three nested contour zones. Alternative embodiments have a different number of nested top-side contour zones.

Embodiments of the invention have been illustrated where the nested contour zones are concentric. The invention is not limited to concentric contours. In an alternative embodiment, two or more of the nested contour zones are not concentric.

Embodiments of the invention have been shown where the copper traces from which bond-post sets are generated are essentially elongated ovals or rectangles. The invention is not limited to a particular shape for a copper trace. In alternative embodiments, one or more copper traces have different shapes.

Although the invention has been described in the context of mounting a single die to a substrate, in alternative embodiments, two or more dies could be mounted to a substrate.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A sub-assembly for a packaged integrated circuit (IC) device, the sub-assembly comprising a planar substrate, the substrate having a top side and a bottom side, wherein:

the top side comprises a plurality of bond-post sets of two or more bond posts arranged in two or more nested contour zones;

the two or more nested contour zones include an outer contour zone and an inner contour zone located inside the outer contour zone;

the two or more bond posts of each bond-post set of the plurality of bond-post sets are directly conductively connected to each other;

each bond-post set of the plurality of bond-post sets comprises an outer bond post located within the outer contour zone and an inner bond post located within the inner contour zone; and the bottom side comprises a plurality of pad connectors, wherein each pad connector is conductively connected to a corresponding bond-post set of the plurality of bond-post sets.

2. The sub-assembly of claim 1, wherein the top side is covered with a solder mask layer having openings for the bond posts of the plurality of bond-post sets.

3. The sub-assembly of claim 2, wherein the bottom side is covered with a solder mask layer having openings for the pad connectors of the plurality of pad connectors.

4. The sub-assembly of claim 1, further comprising an IC die (i) mounted on the top side and (ii) wire bonded only to bond posts located in one contour zone.

5. The sub-assembly of claim 4, wherein the sub-assembly further comprises a molding compound encapsulating the IC die and bond wires.

6. The sub-assembly of claim 4, wherein:
the sub-assembly is a land grid array (LGA) IC device; and
the pad connectors of the plurality of pad connectors are pad openings.

7. The sub-assembly of claim 4, wherein:
the sub-assembly is a ball grid array (BGA) IC device; and
the pad connectors of the plurality of pad connectors are solder ball pad openings.

8. The sub-assembly of claim 4, wherein:
the sub-assembly is a pin grid array (PGA) IC device; and
the pad connectors of the plurality of pad connectors are pins.

9. The sub-assembly of claim 1, further comprising an IC die, wherein:
the die is mounted on the top side using a die-attach material;
the die-attach material covers up at least a portion of the bond posts located within the inner contour zone;
the die-attach material does not cover up the bond posts located within the outer contour zone; and
the die is wire bonded to bond posts located only in the outer contour zone.

10. The sub-assembly of claim 1, further comprising an IC die flip-mounted on the top side and ball bonded to bond posts located only in one of the inner and outer contour zones.

11. The sub-assembly of claim 1, wherein the contour zones are nested rectangular rings.

12. The sub-assembly of claim 11, wherein the contour zones are concentric.

13. The sub-assembly of claim 1, wherein:
the top side further comprises a first intermediate contour zone, different from the inner and outer contour zones and located between the inner and outer contour zones;
each bond-post set of the plurality of bond-post sets further comprises a first intermediate bond post located within the first intermediate contour zone.

14. The sub-assembly of claim 13, wherein:
the sub-assembly is adapted for mounting by a first-size IC die using the bond posts of only the inner contour zone for wire bonding the first-size IC die;
the sub-assembly is adapted for mounting by a second-size IC die, larger than the first-size IC die, using the bond posts of only the intermediate contour zone for wire bonding the second-size IC die; and
the sub-assembly is adapted for mounting by a third-size IC die, larger than the second size IC die, using the bond posts of only the outer contour zone for wire bonding the third-size IC die.

15. The sub-assembly of claim 1, wherein:
the sub-assembly has a die paddle region in the center of the top side for the mounting of a die;
the die paddle region comprises a first thermo-conductive pad; and
the bottom side comprises a second thermo-conductive pad thermo-conductively connected to the first thermo-conductive pad via the substrate.

16. The sub-assembly of claim 15, wherein the thermo-conductive pads and the bond posts comprise copper.

17. The sub-assembly of claim 15, wherein:
the die paddle region comprises a first plurality of thermo-conductive pads that includes the first thermally conductive pad;
the bottom side comprises a second plurality of thermo-conductive pads that includes the second thermo-conductive pad; and
each pad of the first plurality of thermo-conductive pads is thermo-conductively connected to a corresponding pad of the second plurality of thermo-conductive pads via the substrate.

18. A method for manufacturing a sub-assembly for a packaged integrated circuit (IC) device, the method comprising manufacturing a planar substrate having a top side and a bottom side, wherein:
the top side comprises a plurality of bond-post sets of two or more bond posts arranged in two or more nested contour zones;
the two or more nested contour zones include an outer contour zone and an inner contour zone located inside the outer contour zone;
the two or more bond posts of each bond-post set of the plurality of bond-post sets are directly conductively connected to each other;
each bond-post set of the plurality of bond-post sets comprises an outer bond post located within the outer contour zone and an inner bond post located within the inner contour zone; and
the bottom side comprises a plurality of pad connectors, wherein each pad connector is conductively connected to a corresponding bond-post set of the plurality of bond-post sets.

* * * * *